United States Patent
Lo et al.

(10) Patent No.: US 8,250,512 B2
(45) Date of Patent: Aug. 21, 2012

(54) APPARATUS FOR PREVENTING CONGESTIVE PLACEMENT AND ASSOCIATED METHOD

(75) Inventors: Chen-Hsing Lo, Hsinchu Hsien (TW); Chien-Pang Lu, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 23 days.

(21) Appl. No.: 12/954,103

(22) Filed: Nov. 24, 2010

(65) Prior Publication Data

US 2011/0126166 A1    May 26, 2011

(30) Foreign Application Priority Data

Nov. 26, 2009   (TW) .............................. 98140308 A

(51) Int. Cl.
*G06F 17/50* (2006.01)

(52) U.S. Cl. .......... 716/122; 716/119; 716/126

(58) Field of Classification Search .......... 716/119, 716/122, 126
See application file for complete search history.

(56) References Cited

U.S. PATENT DOCUMENTS

| | | | | |
|---|---|---|---|---|
| 6,536,028 B1 * | 3/2003 | Katsioulas et al. | ........... | 716/125 |
| 7,971,174 B1 * | 6/2011 | Khalsa et al. | ............. | 716/129 |
| 2003/0106036 A1 * | 6/2003 | Aoki | .......................... | 716/13 |
| 2003/0217338 A1 * | 11/2003 | Holmes et al. | ................. | 716/2 |
| 2007/0028201 A1 * | 2/2007 | Mehrotra et al. | ............... | 716/12 |
| 2007/0061769 A1 * | 3/2007 | Kumagai | ........................ | 716/13 |
| 2008/0301612 A1 * | 12/2008 | Buehler et al. | ................. | 716/10 |
| 2010/0031220 A1 * | 2/2010 | Buehler et al. | ................. | 716/14 |
| 2010/0122229 A1 * | 5/2010 | Lo et al. | ......................... | 716/10 |
| 2010/0262944 A1 * | 10/2010 | Alpert et al. | .................... | 716/9 |
| 2011/0035712 A1 * | 2/2011 | Gaugler et al. | .............. | 716/105 |

* cited by examiner

*Primary Examiner* — Suresh Memula
(74) *Attorney, Agent, or Firm* — WPAT, PC; Justin King

(57) ABSTRACT

A congestive placement preventing apparatus applied to a circuit layout including electrical devices is provided. The congestive placement preventing apparatus includes an analyzing module, a reserving module and a placing module. The analyzing module performs a routing congestion analysis on the circuit layout to generate an analysis result of the circuit layout. The reserving module correspondingly disposes a plurality of blockages in the circuit layout according to the analysis result, so that a first space with the blockages and a second space are formed in the circuit layout. After the placing module places the electrical devices in the second space, the placing module removes the blockages from the first space, and redistributes the electrical devices in the first space and the second space according to a redistribution rule.

17 Claims, 10 Drawing Sheets

APPARATUS FOR PREVENTING CONGESTIVE PLACEMENT AND ASSOCIATED METHOD

CROSS REFERENCE TO RELATED PATENT APPLICATION

This patent application is based on a Taiwan, R.O.C. patent application No. 098140308 filed on Nov. 26, 2009.

FIELD OF THE INVENTION

The present invention relates to a circuit layout, and particularly, to an apparatus for preventing congestive placement and associated method, which reserves a space for redistributing electrical devices in the circuit layout through disposing virtual blockages, so as to prevent congestive regions from forming in the circuit layout.

BACKGROUND OF THE INVENTION

Accompanied with continual development of electronic technologies, various electronic products are becoming more and more compact and versatile with overwhelmingly diversified functions. Therefore, a large number of electronic devices of all types need to be provided in a chip having a relatively small area in order to meet actual requirements of the electronic products.

However, in certain circuit layouts, it happens that the number of electronic devices within a given area becomes too large. That is, a density of the electronic devices in the area is too high, such that routing between the electronic devices within the area becomes infeasible. The circuit layout may not only fail to pass a design rule check, but the circuit itself may also be unable to function normally.

Refer to FIG. 1 showing a circuit layout formed after automatic placement and routing (APR). As shown in FIG. 1, a congestive region 10 is swarmed with quite a number of combinational cells (e.g. NAND and OR logic gates) c to form a serious congestion with a high density of electrical devices. Thus, routing between the electrical devices within the congestive region 10 is extremely challenging such that the circuit layout 1 may not even pass the design rule check.

FIGS. 2A and 2B show schematic diagrams of routing congestions of a circuit layout in a vertical direction. As shown in FIG. 2A, crosses x marked on the circuit layout indicate points that fail to pass the design rule check. It is apparent that these points show arrangements along a vertical direction, and so congestion pointers $V_1$ and $V_2$ represented by arrows in FIG. 2B are indications of the congestions of the circuit layout in the vertical direction.

Similarly, FIGS. 2C and 2D show schematic diagrams of routing congestion of a circuit layout in a horizontal direction. As shown in FIG. 2C, crosses x marked on the circuit layout indicate points that fail to pass the design rule check. It is apparent that these points show arrangements along a horizontal direction, and so congestion pointers $H_1$ and $H_2$ represented by arrows in FIG. 2D are indications of the congestions of the circuit layout in the horizontal direction.

FIGS. 3A and 3B show schematic diagrams illustrating similar routing congestions with similar circuit layouts. Arrangements of hard macros 31 to 34 relative to a circuit layout 30 in FIG. 3A are similar to those of hard macros 31' to 34' relative to a circuit layout 30' in FIG. 3B, so that congestions also appear similar. For example, the hard macros 31' to 34' are memories or other electronic devices.

As stated, types and numbers of electronic devices included in a circuit layout are bound to be unceasingly expanding along with continual development of electronic technologies, leading to even more severe congestions of the circuit layout. Hence, there is a need for a congestion preventing apparatus and associated method for solving the above shortcomings.

SUMMARY OF THE INVENTION

A congestion preventing apparatus is provided according to the present invention. The congestion preventing apparatus, applied to a circuit layout comprising a plurality of electronic devices, comprises an analyzing module, a reserving module and a placing module.

The analyzing module performs a routing congestion analysis on the circuit layout to generate an analysis result. The reserving module correspondingly disposes a plurality of blockages in the circuit layout according to the analysis result, so that a first space with the blockages and a second space are formed in the circuit layout. The placing module, after placing the electronic devices in the second space, removes the blockages from the first space, and redistributes the electrical devices in the first space and the second space according to a redistribution rule.

In practice, for example, the second space is not distributed with the plurality of blockages; the number of the blockages and a size of the first space are associated with the number of congestions appearing in the circuit layout, and the redistribution rule is evenly distributing the first space to two neighboring electronic devices, or distributing the first space to two neighboring electronic devices according to a weight.

A congestion preventing method is further provided according to the invention. The congestion preventing method is applied to a circuit layout comprising a plurality of electrical devices.

The congestion preventing method comprises: performing a routing congestion analysis on the circuit layout to generate an analysis result, correspondingly disposing a plurality of blockages in the circuit layout according to the analysis result, so as to form a first space comprising the blockages and a second space, placing the electrical devices in the second space, and removing the blockages from the first space, and redistributing the electrical devices in the first space and the second space according to a redistribution rule.

According to the congestion preventing apparatus and method of the invention, a routing congestion analysis is first performed on a circuit layout, blockages are placed at edges of the circuit layout according to the analysis result, and electrical devices of the circuit layout are redistributed. The virtual blockages are then removed, followed by completing the circuit layout through APR. Consequently, the amount of regions where routing is infeasible in the circuit layout obtained from APR is significantly reduced.

Therefore, by utilizing a small portion of areas at edges of the circuit layout, the congestion preventing apparatus and method effectively eliminates chances that the circuit layout fails to pass the design rule checking. Further, relationships between the electronic devices in the circuit layout are maintained after redistribution.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE PREFERRED EMBODIMENT

It is an objective of the invention to provide a congestion preventing apparatus and associated method. Through this congestion preventing apparatus and associated method of the invention, virtual blockages, at reserved spaces at edges of a circuit layout, are disposed for redistributing electronic devices, so as to ensure that the amount of congestive regions in the circuit layout completed through automatic routing and placement (ARP) are significantly reduced. Accordingly, the circuit layout is allowed to successfully pass design rule checking including time constraints while also maintaining relationships between the electronic devices.

A congestive placement preventing apparatus is provided according to a first embodiment of the invention. In this embodiment, the congestive placement preventing apparatus is applied to a circuit layout comprising a plurality of electronic devices. Types and numbers of the electronic devices and connections between the electronic devices are based on actual requirements and are not to be limited by the embodiment to be described below.

Figure 1:
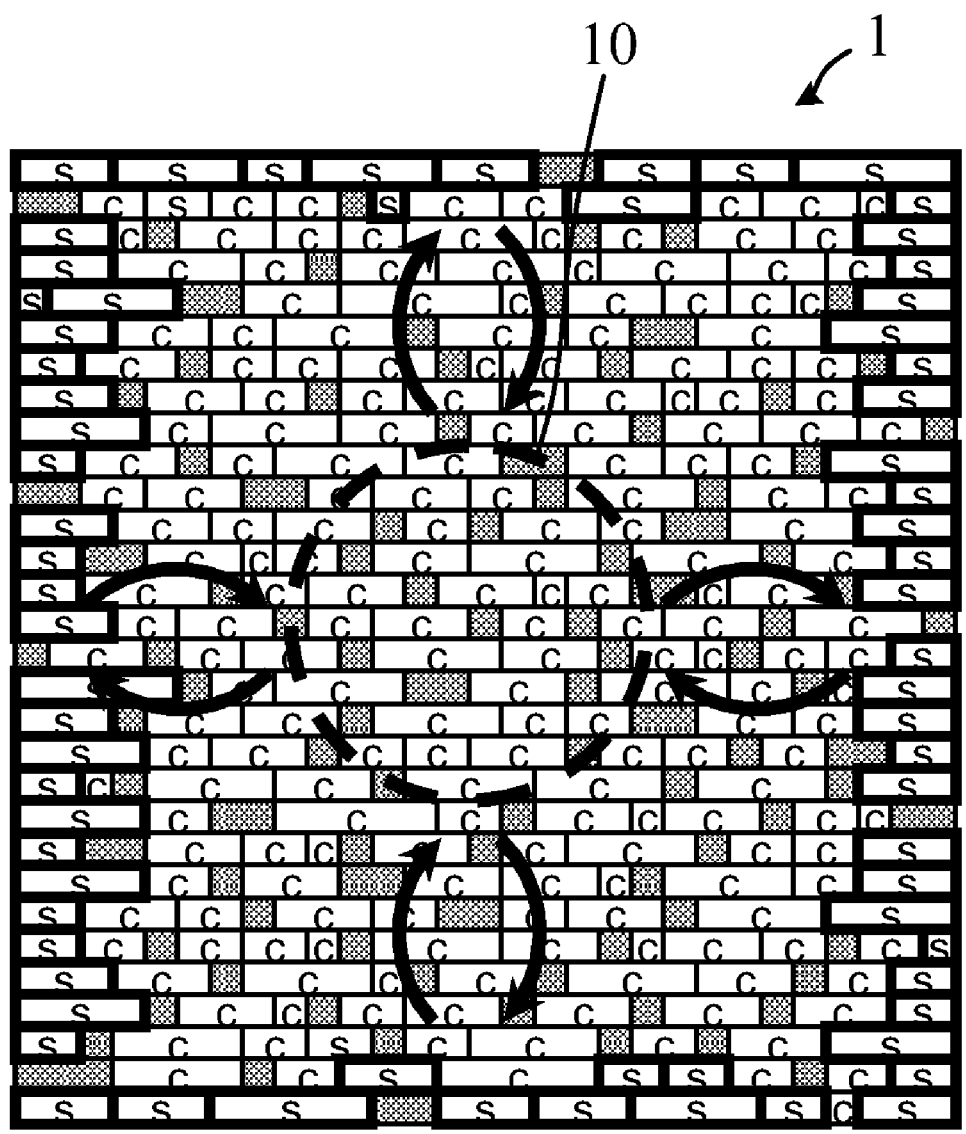
FIG. 1 is a schematic diagram of a circuit layout completed through automatic placement and routing (ARP)
Figure 2A:
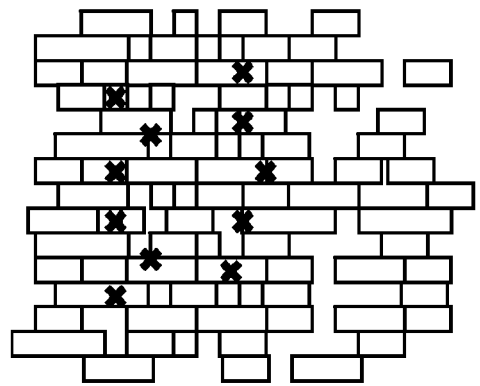
FIGS. 2A and 2B are schematic diagrams illustrating routing congestions in a vertical direction.
Figure 2B:
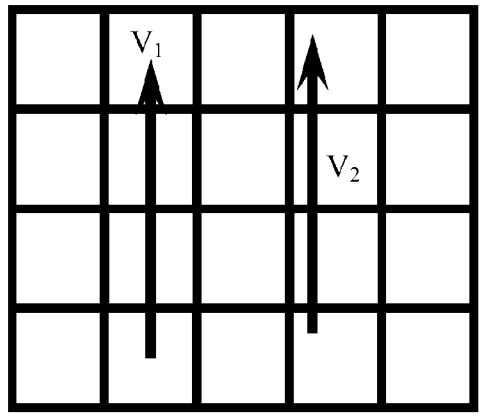
Figure 2C:
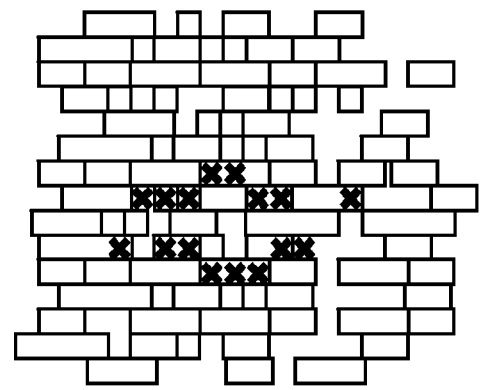
FIGS. 2C and 2D are schematic diagrams illustrating routing congestions in a horizontal direction.
Figure 2D:
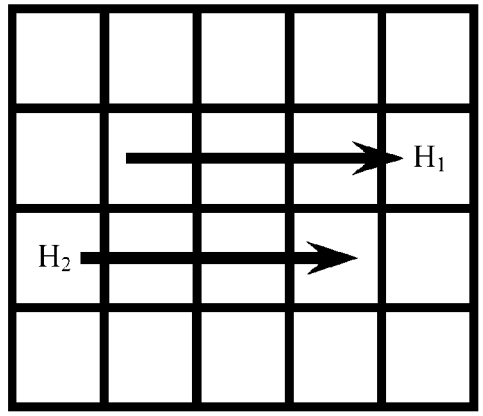
Figure 3A:
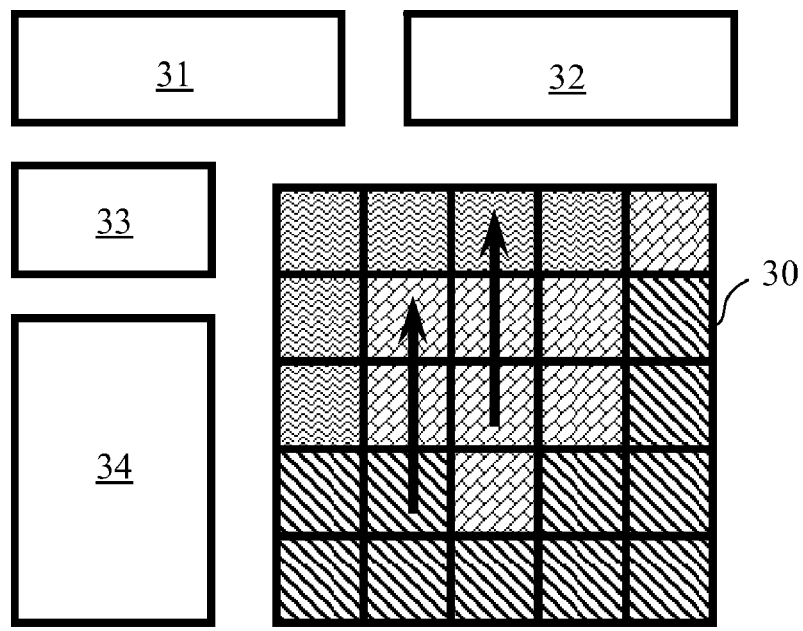
FIGS. 3A and 3B are schematic diagrams of similar congestions of a similar circuit layout.
Figure 3B:
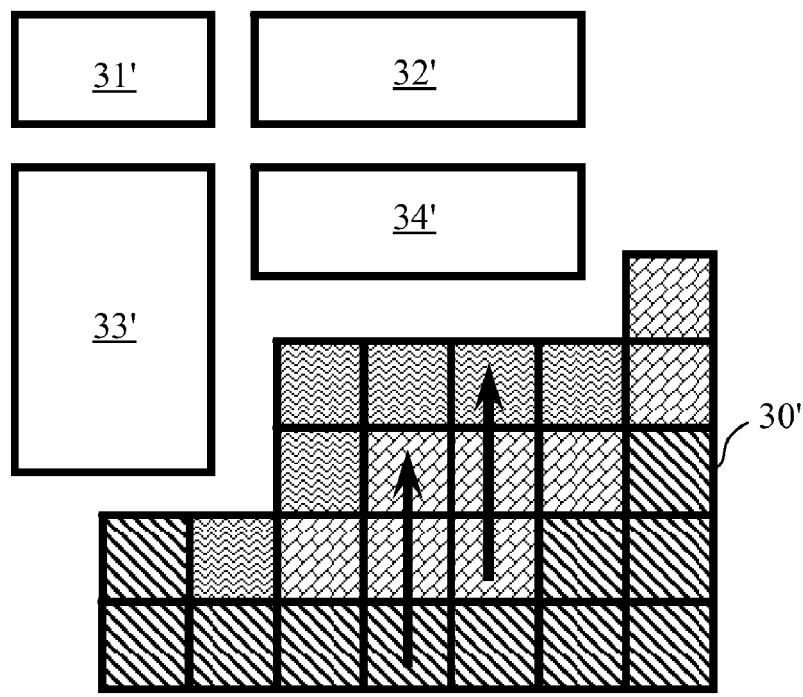
Figure 4:
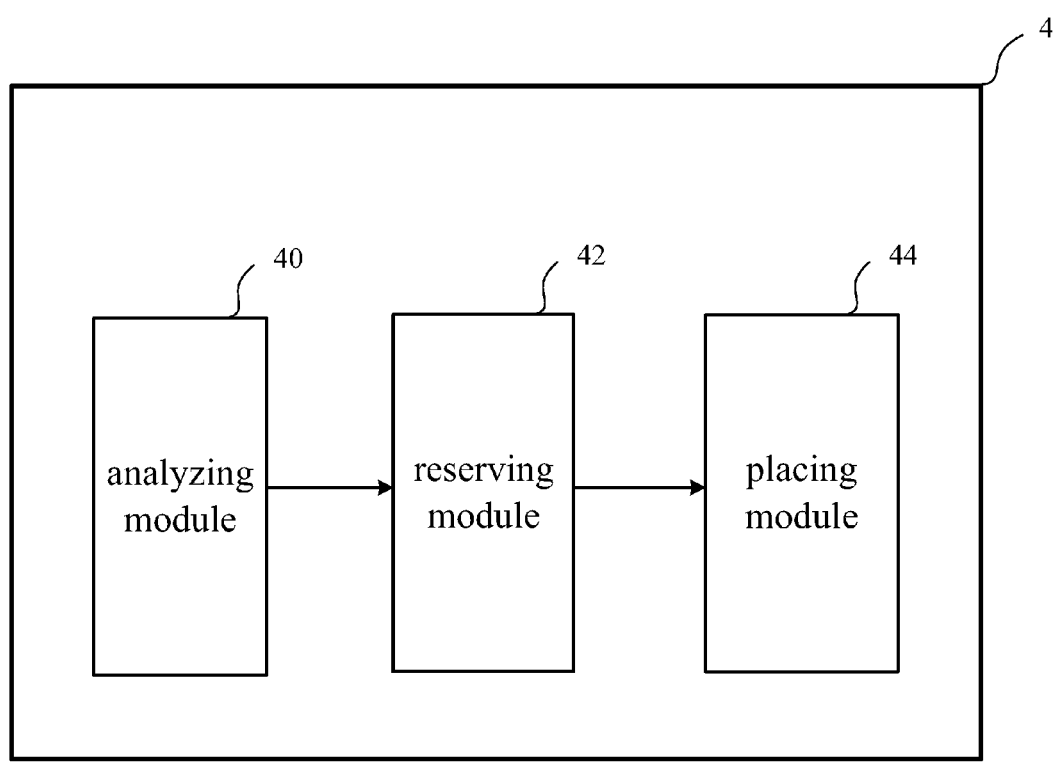
FIG. 4 is a block diagram of a congestive placement preventing apparatus according to a first embodiment of the invention.

FIG. 4 shows a block diagram of the congestive placement preventing apparatus applied to the circuit layout. As shown in FIG. 4, a congestive placement preventing apparatus 4 comprises an analyzing module 40, a reserving module 42 and a placing module 44. The analyzing module 40 is coupled to the reserving module 42, the reserving module 42 is coupled to the placing module, and the analyzing module 40, the reserving module 42 and the placing module 44 are all coupled to the circuit layout (not shown). The modules of the congestive placement preventing apparatus are to be discussed below.

The analyzing module 40 of the congestive placement preventing apparatus 4 performs a routing congestion analysis on the circuit layout to generate a routing congestion analysis result. For example, the analyzing module 40 first divides the circuit layout into a plurality of analysis areas, and determines whether densities of the electronic devices within the analysis areas are too high to generate the routing congestion analysis result corresponding to congestions in the analysis areas.

For example, the analyzing module 40 quantizes the congestions by reflecting the number of congestions of each analysis area in the routing congestion analysis result. Further, the analyzing module 40 may also perform the routing congestion analysis in horizontal and vertical directions to correspondingly generate vertical and horizontal routing congestion analysis results. Other approaches and orders may be adopted by the analyzing module 40 to perform the routing congestion analysis, and are also encompassed within the scope of the invention.

Figure 5A:
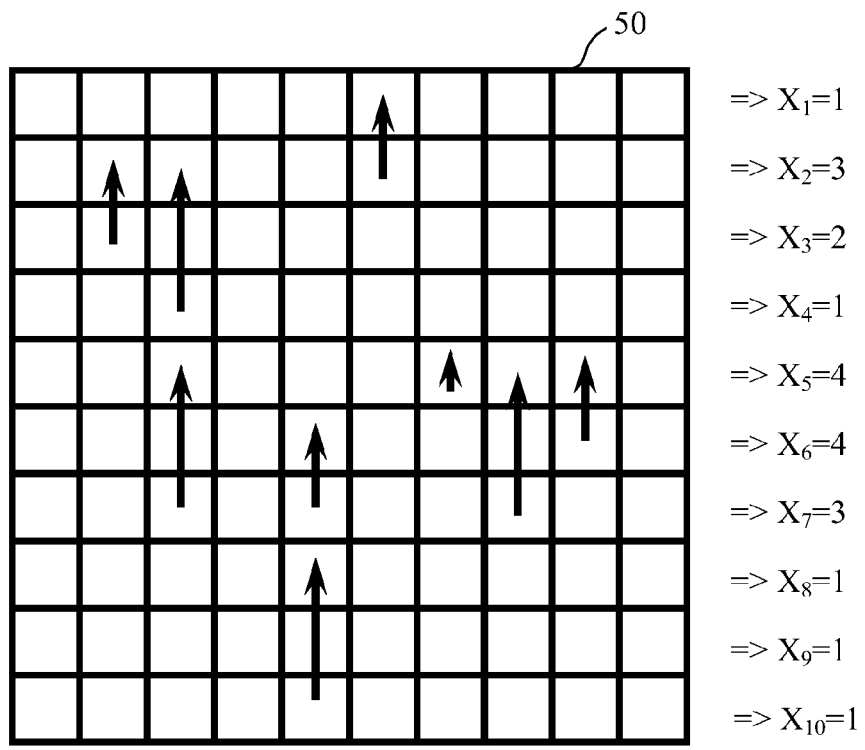
FIGS. 5A to 5E are schematic diagrams illustrating routing congestions in a vertical direction being eliminated by the congestive placement preventing apparatus.

FIG. 5A shows a vertical routing congestion analysis result corresponding to vertical congestions of a circuit layout 50 after performing the routing congestion analysis along a horizontal direction of the circuit layout 50 by the analyzing module 40. As shown in FIG. 5A, the analyzing module 40 obtains values $X_1$ to $X_{10}$ associated with the numbers of congestions in respectively rows from the top to the bottom of the circuit layout 50. The values corresponding to the number of congestions, $X_1$ to $X_{10}$, are 1, 3, 2, 1, 4, 4, 3, 1, 1, 1 and 1, respectively.

The reserving module 42 of the congestive placement preventing apparatus 4 disposes blockages in the analysis areas of the circuit layout according to the routing congestion analysis result obtained by the analyzing module 40, so as to form a first space composed of the blockages and a second space without any blockages.

Figure 5B:
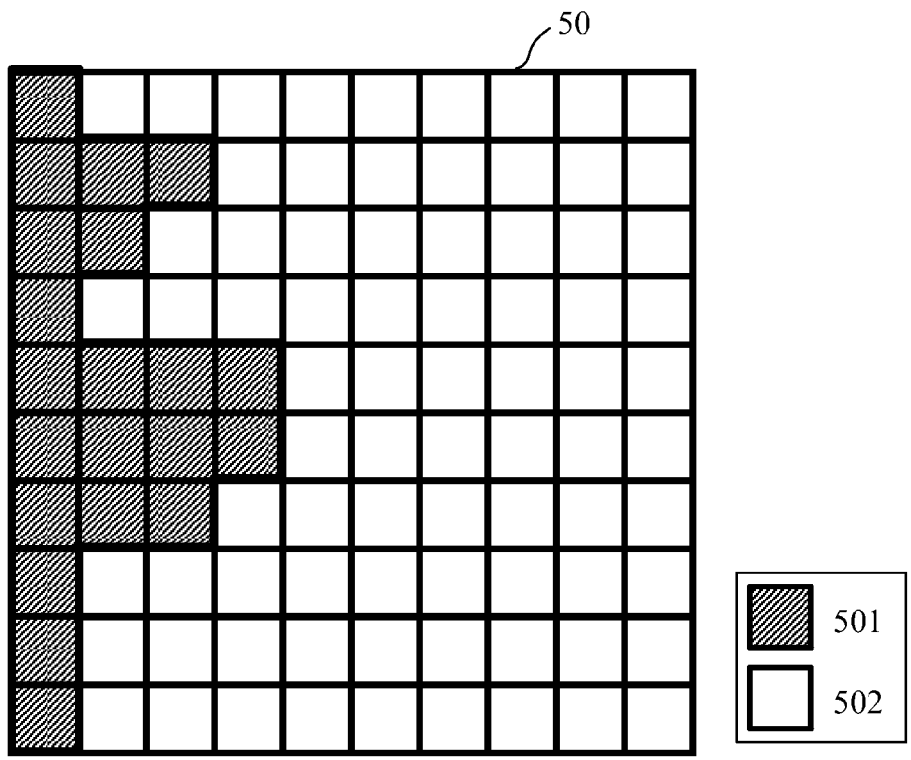

For example, the number of blockages disposed in a particular analyzing area is associated with congestions of the same analyzing area, e.g., the number of congestion pointers in the analyzing area. As shown in FIG. 5B, at a left edge of each horizontal row of the circuit layout 50, the reserving module 42, respectively from the top to the bottom, disposes blockages in numbers corresponding to the values $X_1$ to $X_{10}$. More specifically, the reserving module 42 disposes for the rows 1, 3, 2, 1, 4, 4, 3, 1, 1, and 1 blockages (represented by shaded squares in the diagram), so as to form a first space 501 composed of the blockages and a second space 502 without any blockages. For example, the reserving module 42 may also dispose blockages for each row in any region of the circuit layout 50, including the right edge.

Next, the placing module 44 places the electronic devices of the circuit layout 50 within the second space 502 previously not placed with any blockages. That is, since the first space 501 is entirely occupied by the blockages, the placing module 44 is allowed to only place the electronic devices in the second space 502, but not within the first space 501, so that the first space 501 is reserved through the virtual blockages for subsequent redistribution of the electronic devices.

Figure 5C:
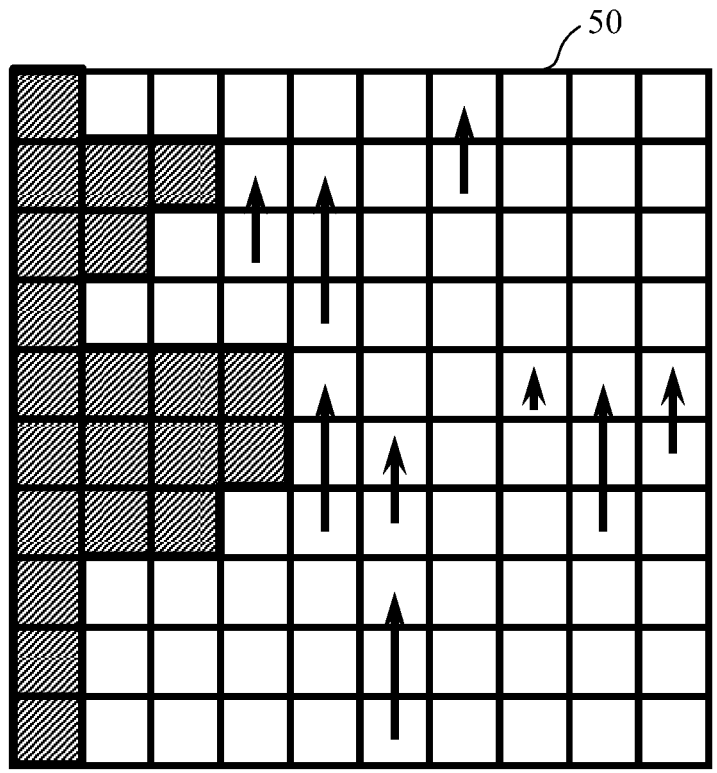

As shown in FIG. 5C, since the blockages are disposed at the edge of the circuit layout 50, a placement outcome from the placing module 44 placing the electronic devices within the second space 502 is similar to the arrangement shown in FIG. 5A.

Figure 5D:
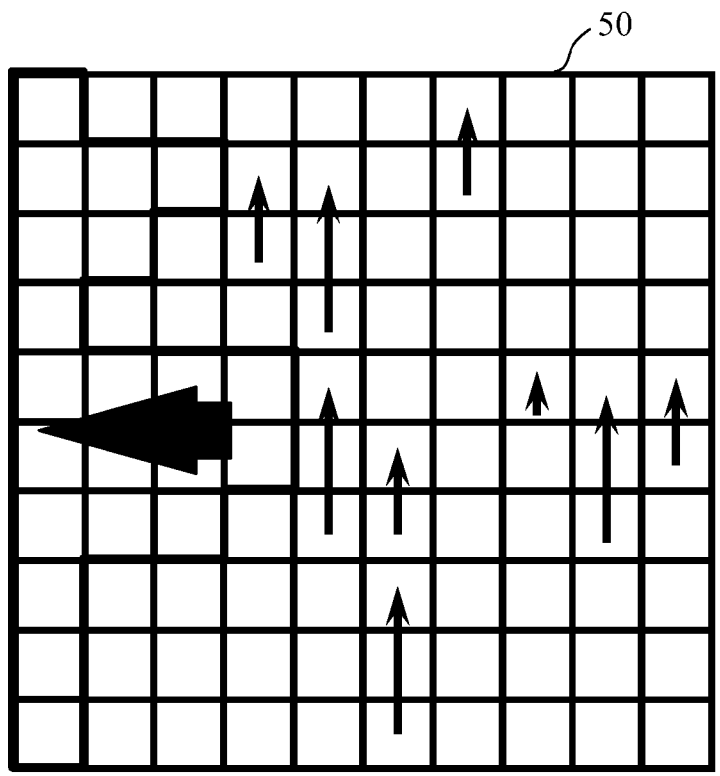
Figure 5E:
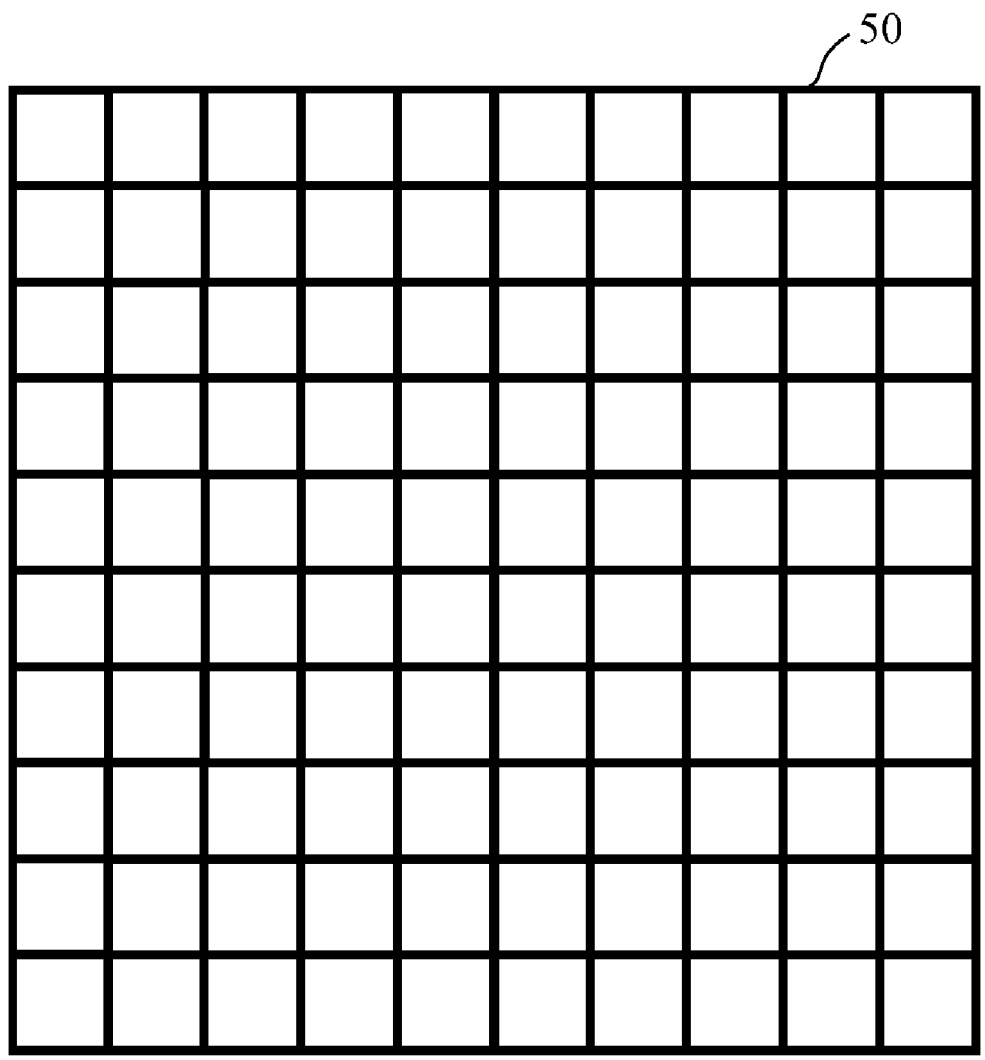

The placing module 44 then removes the blockages from the first space 501, as shown in FIG. 5D. At this point, the first space 501 no longer comprises the blockages, and the placing module 44 redistributes the electronic devices within the first space 501 and the second space 502. FIG. 5E shows the status of congestion pointer(s) of the circuit layout 50. By comparing FIGS. 5D and 5E, it is apparent that the number of congestion pointers that previously appeared in the second space 502 is significantly reduced and even completed eliminated, i.e., congestion is prevented.

In practice, the redistribution rule may be, for example, evenly distributing the first space to any two neighboring electronic devices, or other distribution approaches based upon actual needs.

Figure 6A:
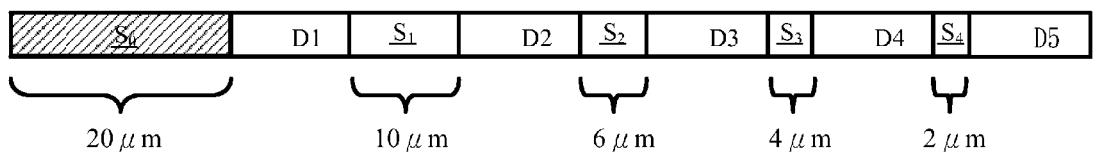
FIGS. 6A and 6B are schematic diagrams of the congestive placement preventing apparatus evenly distributing a reserved space.

FIG. 6A shows a schematic diagram of a particular row of the circuit layout before redistribution. As shown, the row from left to right comprises a reserved space $S_0$, a first device D1, space $S_1$, a second device D2, space $S_2$, a third device D3, space $S_3$, a fourth device D4, space $S_4$ and a fifth device D5. $S_1$ is the original space between the first and second devices, $S_2$ is the original space between the second and third devices, $S_3$ is the original space between the third and fourth devices, and $S_4$ is the original space between the fourth and fifth devices.

Figure 6B:
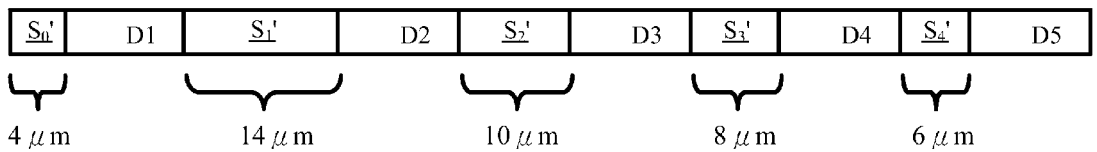

In this embodiment, suppose the reserved space $S_0$=20 µm, and the original spaces $S_1$=10 µm, $S_2$=6 µm, $S_3$=4 µm and $S_4$=2 µm, and the redistribution rule requires that the placing module 44 redistributing the electronic devices evenly distributes the reserved space to the spaces between the devices. That is, the reserved space $S_0$=20 µm is divided by 5 (to evenly distribute to the five spaces including the reserved space $S_0$ itself and the four spaces $S_1$ to $S_4$) to obtain an average reserve space of 4 µm, which is then respectively added to $S_0$ and each space, $S_1$ through $S_4$. Referring to FIG. 6B, redistributed spaces $S_0'$, $S_1'$, $S_2'$, $S_3'$ and $S_4'$ after the placing module 44 redistributes the electronic devices are respectively assigned 4 µm, 14 µm, 10 µm, 8 µm and 6 µm. At this point, since the distances between the electronic devices are enlarged, possibilities that routing congestions are formed in the circuit layout are greatly reduced. For example, based on specific requirements, the reserved space may also be distributed to only the spaces between the devices but not to the left side of the first device. That is, the reserved space $S_0$=20 µm may also be divided by 4 corresponding to the four spaces $S_1$ to $S_4$ to obtain an average reserved space that is then respectively added to the four spaces $S_1$ to $S_4$ so that the left side of the first device is not provided with any reserved space, isolating readjustment to the spaces between devices.

Figure 7A:
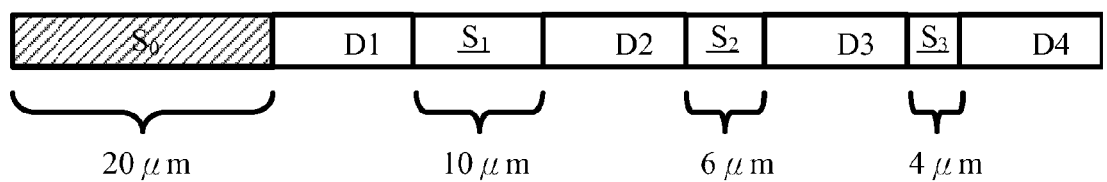
FIGS. 7A and 7B are schematic diagrams of the congestive placement preventing apparatus distributing a reserved space according to a weight.

Further, for example, the redistribution rule may also distribute the first space to any number of neighboring electronic devices according to a weight associated with the size of an original space between neighboring electronic devices. For instance, the redistribution rule may dictate distributing the first space to two neighboring electronic devices according to a weight associated with the specific size of the original space between the two neighboring electronic devices. Referring to FIG. 7A, the row from left to right comprises a reserved space $S_0$, a first device D1, space $S_1$, a second device D2, space $S_2$, a third device D3, space $S_3$, and a fourth device D4 where the reserved space $S_0$=20 µm, and the original spaces $S_1$=10 µm, $S_2$=6 µm, and $S_3$=4 µm. The weight may be chosen to be directly proportional to the original spaces between the electronic devices.

Figure 7B:
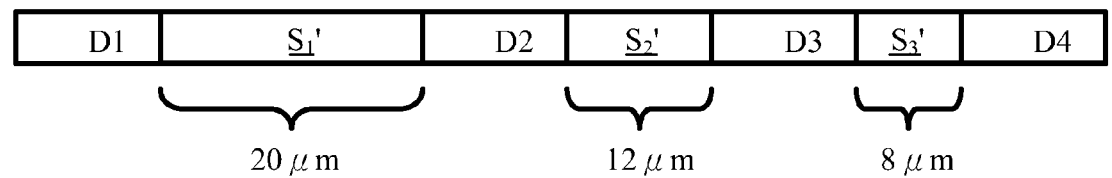

Therefore, a portion of the reserved space $S_0$ distributed to the original space $S_1$ is 20 µm*[10 µm/(10 µm+6 µm+4 µm)]=10 µm, i.e., the redistributed $S_1'$ is 10 µm+10 µm=20 µm; a portion of the reserved space $S_0$ distributed to the original space $S_2$ is 20 µm*[6 µm/(10 µm+6 µm+4 µm)]=6 µm, i.e., the redistributed $S_2'$ is 6 µm+6 µm=12 µm; and a portion of the reserved space $S_0$ distributed to the original space $S_3$ is 20 µm*[4 µm/(10 µm+6 µm+4 µm)]=4 µm, i.e., the redistributed $S_3'$ is 4 µm+4 µm=8 µm, as shown in FIG. 7B. At this point, the distances between the electronic devices are enlarged so that possibilities that routing congestions are formed in the circuit layout are greatly reduced. Further, based on specific requirements, for example, the reserved space $S_0$ may also be regarded as a space of a device, and the left side of the first device is provided with a reserved space. More specifically, $S_0$=20 µm may also be distributed to $S_0$ and $S_1$ to $S_4$ according to weights of $S_0$ and $S_1$ to $S_4$, such that the left side of the first device is provided with a space $S_0$ distributed according to the weight of $S_0'$ (not shown in FIG. 7B).

Figure 8:
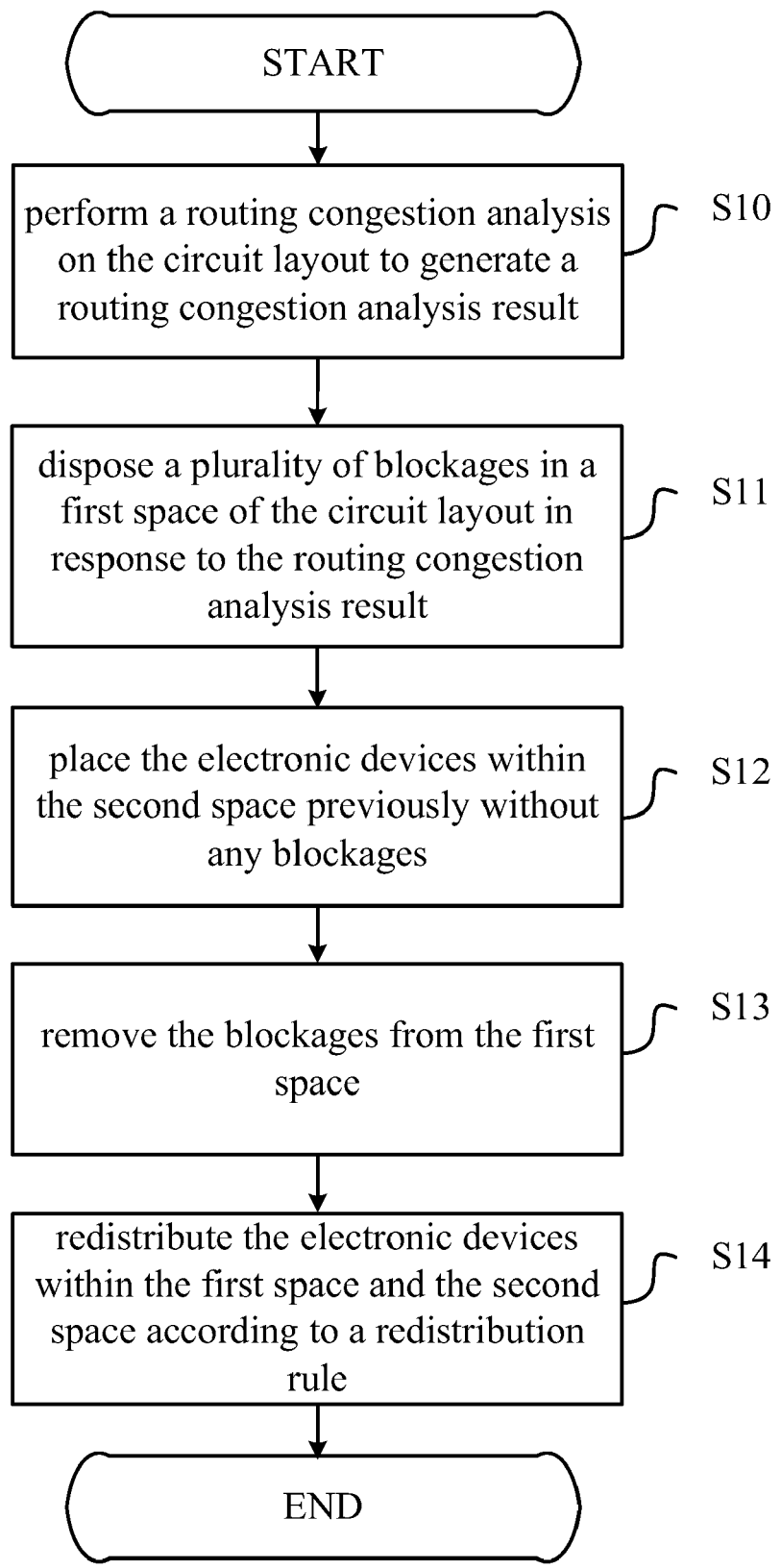
FIG. 8 is a flowchart of a congestive placement preventing method according to a second embodiment of the invention.

A congestive placement preventing method is provided according to a second embodiment of the present disclosure. The congestive placement preventing method is applied to a circuit layout comprising a plurality of electronic devices. FIG. 8 shows a flowchart of the congestive placement preventing method.

The method starts with Step S10 to perform a routing congestion analysis on the circuit layout to generate a routing congestion analysis result. For example, the routing congestion analysis result is associated with a density of the electronic devices placed in the circuit layout. Further, in Step S10, the routing congestion analysis may respectively be performed along horizontal and vertical directions of the circuit layout to respectively generate vertical and horizontal routing congestion analysis results.

For example, in Step S10, the circuit layout is divided into a plurality of analysis areas, and the routing congestion analysis is respectively performed on the analysis areas to routing congestion analysis results corresponding to routing congestions of the analysis areas. Further, the status of routing congestions of a particular analysis area is associated with the number of times of routing congestions in the particular area.

In Step S11, a plurality of blockages are disposed in a first space of the circuit layout in response to the routing congestion analysis result. Accordingly, an overall routing area of the circuit layout is distinguished into a first region comprising the blockages, and a second region without any blockages. More specifically, the first space is substantially reserved as a reserved area for subsequent redistribution of the electronic devices. As an example, in this embodiment the blockages are disposed at an edge of the circuit layout to form the first space.

In Step S12, the electronic devices are placed within the second space previously without any blockages. The method proceeds to Step S13 to remove the blockages from the first space. In Step S14, the electronic devices are redistributed within the first space and the second space according to a redistribution rule.

For example, the redistribution rule is evenly distributing the first space to two neighboring electronic devices, or distributing the first space to two neighboring electronic devices according to a weight. The weight, for example, may be associated with an original space between the two neighboring electronic devices, or a size of a reserved space. Other details of the congestive placement preventing method are similar to those disclosed in the first embodiment, and shall be omitted here for brevity.

With the embodiments of the invention, the congestion placement preventing apparatus and associated method first performs routing congestion analysis on a circuit layout, and according to a routing congestion analysis result, disposes at an edge of the circuit layout virtual blockages for reserving spaces for redistributing the electronic devices of the circuit layout. The virtual blockages are then removed to complete the circuit layout through APR. Accordingly, in the final APR result, the amount of congested areas where routing is infeasible is greatly reduced.

By using the congestion placement preventing apparatus and associated method, through reserving minimal spaces at an edge of a circuit layout, not only failures associated with the prior art in passing design rule checking are effectively prevented, but also relationships between the electronic devices are maintained.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. An apparatus for preventing congestive placement, applied to a circuit layout comprising a plurality of electronic devices, comprising:
   an analyzing module, for performing a routing congestion analysis to generate an analysis result;
   a reserving module, for correspondingly disposing a plurality of blockages in the circuit layout according to the analysis result, so as to form a first space comprising the blockages, and a second space; and
   a placing module, for placing the electronic devices in the second space, removing the blockages from the first space, and redistributing the electronic devices in the first space and the second space according to a redistribution rule;
   wherein the redistribution rule is evenly distributing the first space to two neighboring electronic devices.

2. The apparatus as claimed in claim 1, wherein the placing module disposes the blockages at an edge area of the circuit layout to form the first space.

3. The apparatus as claimed in claim 1, wherein a number of the blockages and a size of the first space are associated with a number of congestions in the circuit layout.

4. The apparatus as claimed in claim 1, wherein the analysis result is associated with a density of the electronic devices in the circuit layout.

5. The apparatus as claimed in claim 1, wherein the analyzing module performs the routing congestion analysis on the circuit layout along a horizontal direction to generate the analysis result corresponding to a vertical direction of the circuit layout.

6. The apparatus as claimed in claim 1, wherein the analyzing module performs the routing congestion analysis on the circuit layout along a vertical direction to generate the analysis result corresponding to a horizontal direction of the circuit layout.

7. The apparatus as claimed in claim 1, wherein the analyzing module divides the circuit layout into a plurality of analysis areas, and performs the routing congestion analysis on the analysis areas to generate the analysis result corresponding to congestions in the analysis areas.

8. The apparatus as claimed in claim 7, wherein a congestion status of one of the analysis areas is respectively associated with the number of congestions within the analysis areas.

9. An apparatus for preventing congestive placement, applied to a circuit layout comprising a plurality of electronic devices, comprising
   an analyzing module, for performing a routing congestion analysis to generate an analysis result;
   a reserving module, for correspondingly disposing a plurality of blockages in the circuit layout according to the analysis result, so as to form a first space comprising the blockages, and a second space; and
   a placing module, for placing the electronic devices in the second space, removing the blockages from the first space, and redistributing the electronic devices in the first space and the second space according to a redistribution rule;
   wherein the redistribution rule is distributing the first space to two neighboring electronic devices according to a weight associated with a size of an original space between the two neighboring electronic devices.

10. A method for preventing congestive placement, applied to circuit layout comprising a plurality of electronic devices, the method comprising:
    performing a routing congestion analysis on the circuit layout to generate an analysis result;
    disposing a plurality of blockages in the circuit layout according to the analysis result, so as to form a first space comprising the blockages, and a second space;
    removing the blockages from the first space; and
    redistributing the electronic devices in the first space and the second space according to a redistribution rule, wherein the redistribution rule is distributing the first space to two neighboring electronic devices according to a weight associated with a size of an original space between the two neighboring electronic devices.

11. The method as claimed in claim 10, wherein the blockages are disposed at an edge area of the circuit layout to form the first space.

12. The method as claimed in claim 10, wherein a number of the blockages and a size of the first space are associated with a number of congestions in the circuit layout.

13. The method as claimed in claim 10, wherein the analysis result is associated with a density of the electronic devices in the circuit layout.

14. The method as claimed in claim 10, wherein the routing congestion analysis is performed on the circuit layout along a horizontal direction to generate the analysis result corresponding to a vertical direction of the circuit layout.

15. The method as claimed in claim 10, wherein the routing congestion analysis is performed on the circuit layout along a vertical direction to generate the analysis result corresponding to a horizontal direction of the circuit layout.

16. The method as claimed in claim 10, wherein the circuit layout is divided into a plurality of analysis areas, and the routing congestion analysis is performed on the analysis areas to generate the analysis result corresponding to congestions in the analysis areas.

17. The method as claimed in claim 16, wherein a congestion status of one of the analysis areas is respectively associated with the number of congestions within the analysis areas.

* * * * *